(12) United States Patent
Sakurayama

(10) Patent No.: US 11,083,121 B2
(45) Date of Patent: Aug. 3, 2021

(54) COMPONENT MOUNTING APPARATUS

(71) Applicant: FUJI CORPORATION, Chiryu (JP)

(72) Inventor: Takeshi Sakurayama, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 321 days.

(21) Appl. No.: 16/071,947

(22) PCT Filed: Jan. 25, 2016

(86) PCT No.: PCT/JP2016/051969
§ 371 (c)(1),
(2) Date: Jul. 23, 2018

(87) PCT Pub. No.: WO2017/130267
PCT Pub. Date: Aug. 3, 2017

(65) Prior Publication Data
US 2019/0037741 A1 Jan. 31, 2019

(51) Int. Cl.
*H05K 13/08* (2006.01)
*H05K 13/04* (2006.01)

(52) U.S. Cl.
CPC ....... *H05K 13/089* (2018.08); *H05K 13/0408* (2013.01); *H05K 13/0409* (2018.08);
(Continued)

(58) Field of Classification Search
CPC ........... H05K 13/0408; H05K 13/0409; H05K 13/081; H05K 13/0813; H05K 13/0882;
(Continued)

(56) References Cited

U.S. PATENT DOCUMENTS

2002/0044432 A1\* 4/2002 Nakano ............... H05K 13/089
361/760
2002/0056188 A1\* 5/2002 Yamaguchi ........ H05K 13/0813
29/743

FOREIGN PATENT DOCUMENTS

JP 2002-237700 A 8/2002
JP 2007273520 A \* 10/2007
(Continued)

OTHER PUBLICATIONS

International Search Report dated Apr. 26, 2016 in PCT/JP2016/051969 filed Jan. 25, 2016.

*Primary Examiner* — A. Dexter Tugbang
(74) *Attorney, Agent, or Firm* — Oblon, McClelland, Maier & Neustadt, L.L.P.

(57) ABSTRACT

A component mounting apparatus includes a nozzle that sucks a component supplied from a feeder, conveys the component to a predetermined position on a substrate, and mounts the component in the predetermined position. The component mounting apparatus controls an XY-robot to perform repeatedly the component mounting operation while performing a thermal correction from a start of the component mounting operation as a result of a power supply being turned on until an amount of positional deviation due to heat from the XY-robot reaches a steady state. After the steady state is achieved, the component mounting apparatus controls the XY-robot to perform repeatedly the component mounting operation while performing a steady state correction using a correction amount resulting immediately after the steady state is achieved without performing the thermal correction and controls the XY-robot to perform a dummy operation for maintaining the steady state during a standby period.

6 Claims, 5 Drawing Sheets

(52) U.S. Cl.
CPC ....... *H05K 13/081* (2018.08); *H05K 13/0813* (2018.08); *H05K 13/0882* (2018.08); *Y10T 29/53174* (2015.01); *Y10T 29/53191* (2015.01)

(58) Field of Classification Search
CPC ............ H05K 13/089; Y10T 29/53174; Y10T 29/53191
See application file for complete search history.

(56) References Cited

FOREIGN PATENT DOCUMENTS

| | | |
|---|---|---|
| JP | 2009-295709 A | 12/2009 |
| JP | 2010-251450 A | 11/2010 |

\* cited by examiner

COMPONENT MOUNTING APPARATUS

TECHNICAL FIELD

The present application relates to a component mounting apparatus.

BACKGROUND ART

Conventionally, there have been known component mounting apparatuses having a nozzle attached to a head movable in an XY-plane using an XY robot and configured to perform a component mounting operation in which the nozzle sucks a component supplied from a component supply device, carries the component to a predetermined position on a substrate and mounts the component in the predetermined position. As a component mounting apparatus of this type, a component mounting apparatus is known in which no actual mounting or producing operation is executed but an aging operation is executed until deformation due to heat of a motor or the like reaches a steady state after a power supply is turned on, an actual producing operation accompanied by a component mounting operation is executed after the deformation has reached a steady state, the apparatus is stopped after completion of the actual producing operation, and when the temperature in the apparatus becomes lower than that in the steady state, the aging operation is executed again to restore the steady state before a subsequent actual producing operation is executed (see FIG. 6 of Patent Document 1). According to the description of the component mounting apparatus, a deterioration in mounting accuracy due to a temperature change caused by stopping the apparatus or the like can be prevented by the automatic aging operation, whereby the productivity can be improved by reducing the frequency at which the thermal correction is performed.

PRIOR ART DOCUMENT

Patent Document

Patent Document 1: JP-A-2002-237700

BRIEF SUMMARY

Problems to Be Solved

However, since it may take some time about one hour from the time when the power supply is turned on until the time when the deformation due to heat reaches a steady state, the component mounting apparatus of Patent Document 1 which does not execute an actual producing operation during this period cannot always be said to be high in productivity. In addition, since the apparatus is left stopped from a completion of one actual producing operation to a start of another subsequent producing operation, the temperature of the apparatus may become lower than that in the steady state. As this occurs, there may occur a case where although a necessary preparation for a subsequent producing operation is made, the actual producing operation cannot be started, because one aging operation needs to be executed to restore the apparatus to the steady state. Therefore, it has been desired to reduce the frequency at which the thermal correction is performed while giving priority to productivity.

The disclosure has been made in view of the problem described above, and a main object thereof is to reduce the frequency at which a thermal correction is performed while giving priority to productivity.

Means for Solving the Problem

According to the disclosure, there is provided a component mounting apparatus having a nozzle attached to a head movable in an XY-plane using an XY-robot and configured to perform a component mounting operation in which the nozzle sucks a component supplied from a component supply device, carries the component to a predetermined position on a substrate and mounts the component in the predetermined position, the component mounting apparatus comprising a control unit for controlling the XY-robot to perform repeatedly the component mounting operation while performing a thermal correction during a period from a start of the component mounting operation as a result of a power supply being turned on until an amount of positional deviation due to heat from the XY-robot reaches a steady state, controlling, after the positional deviation amount has reached the steady state, the XY-robot to perform repeatedly the component mounting operation while performing a steady state correction using a correction amount resulting immediately after the positional deviation amount reaches the steady state without performing a thermal correction, and controlling the XY-robot to perform a dummy operation to maintain the steady state during a standby period when the component mounting operation is not performed.

This component mounting apparatus performs repeatedly the component mounting operation while performing the thermal correction during the period from the start of the component mounting operation as a result of the power supply being turned on until the amount of positional deviation due to the heat from the XY-robot reaches the steady state. Namely, the component mounting apparatus performs the component mounting operation even during the period when the steady state has not yet been achieved. Additionally, after the steady state is achieved, the component mounting apparatus performs repeatedly the component mounting operation while performing the steady state correction using the correction amount resulting immediately after the steady state is achieved without performing the thermal correction and performs the dummy operation to maintain the steady state during the standby time during which the component mounting operation is not performed. Namely, since the component mounting operation is performed without performing the thermal correction after the steady state is achieved, the frequency at which the thermal correction is performed is reduced. In addition, since the steady state is maintained by performing the dummy operation during the standby period, even though the component mounting apparatus is put on standby after, for example, a component mounting operation based on one production job is completed, the next production job can be started with no thermal correction as soon as a preparation for a component mounting operation based on the next production job is completed. Thus, as described above, according to the disclosure, it is possible to reduce the frequency at which the thermal correction is performed while giving priority to productivity.

In the component mounting apparatus of the disclosure, the component supply device may be detachably attached to the component mounting apparatus, and the control unit may control the XY-robot to perform the dummy operation in an area where a hand is not inserted when an operator attaches or detaches the component supply device. When it becomes necessary to replenish the components or to replace one type of components to another type of components in the component supply device after a component mounting operation is started, the operator detaches and attaches again the component supply device. As this occurs, the component mounting apparatus is in a standby state, and the XY-robot is performing a dummy operation. Since the dummy operation is performed in the area where the hand cannot be inserted when the operator detaches or attaches again the component supply device, the operator can safely detach and attach again the component supply device.

In the component mounting apparatus of the disclosure, a partition may be provided between the component supply device and an area of the component mounting apparatus where the head moves, and the control unit may control the XY-robot to perform the dummy operation further inwards of the component mounting apparatus than the partition. In the case where this configuration is adopted, since the dummy operation is performed further inwards of the component mounting apparatus than the partition, the operator can safely detach and attach again the component supply device.

In the component mounting apparatus of the disclosure, in performing the thermal correction, the control unit may measure the positional deviation amount, calculate a position correcting amount of the XY-robot according to the magnitude of the positional deviation amount and correct a position of the XY-robot using the position correcting amount. In addition, the controller may determine whether or not the positional deviation amount reaches a steady state based on a change with time of the positional deviation amount or a transition in the change. By doing so, it is possible to accurately determine that the thermal deformation amount is saturated to reach the steady state.

DETAILED DESCRIPTION

Figure 1:
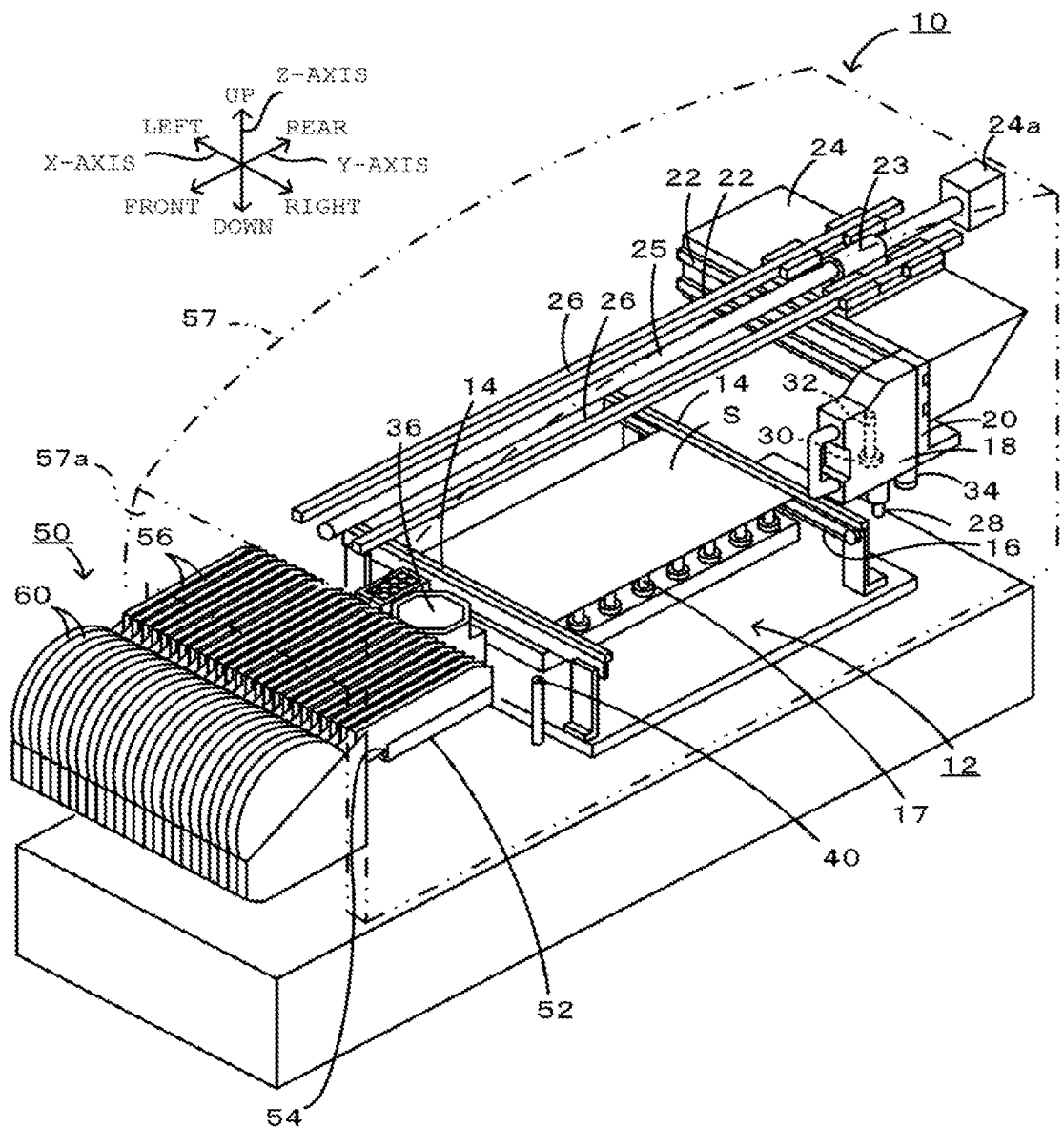
FIG. 1 is a perspective view of a component mounting apparatus 10.
Figure 2:
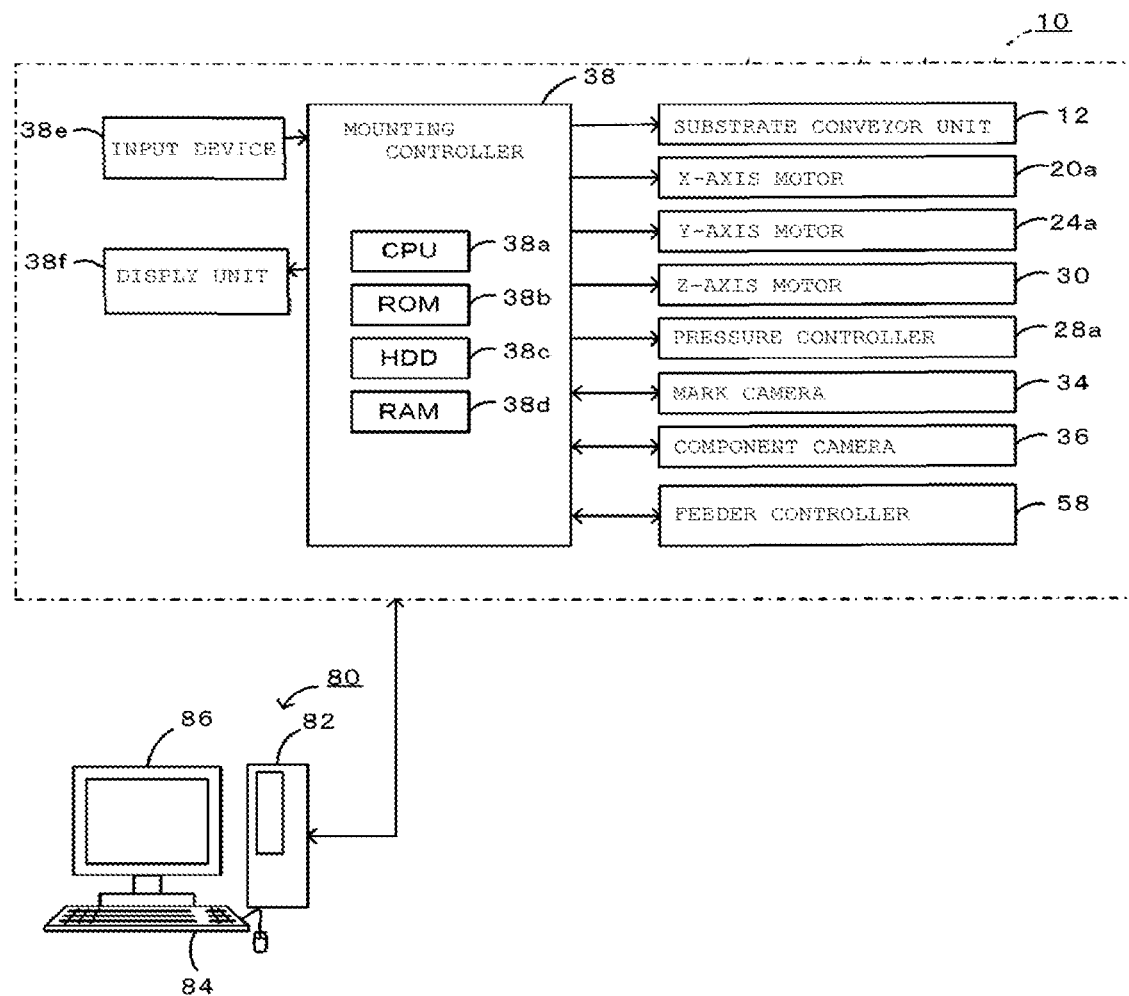
FIG. 2 is an explanatory view showing electrical connections of the component mounting apparatus 10.

Referring to the drawings, a preferred embodiment of the disclosure will be described. FIG. 1 is a perspective view of a component mounting apparatus 10, and FIG. 2 is an explanatory view showing electrical connections of the component mounting apparatus 10. In this embodiment, a left and right direction (an X-axis), a front and rear direction (a Y-axis), and an up and down direction (a Z-axis) are as shown in FIG. 1.

As shown in FIG. 1, the component mounting apparatus 10 includes a substrate conveyor unit 12, a head 18, a nozzle 28, a mark camera 34, a component camera 36, a mounting controller 38 (refer to FIG. 2) for executing various types of controls, and a reel unit 50. A cover 57 configured to cover the whole of the component mounting apparatus 10 is mounted so as to be opened and closed.

The substrate conveyor unit 12 conveys a substrate S from the left to the right by conveyor belts 16, 16 (only one of which is shown in FIG. 1) attached individually to a pair of left and right support plates 14, 14. Additionally, the substrate conveyor unit 12 fixes the substrate S in place by lifting up the substrate S from therebelow using support pins 17 disposed underneath the substrate S to bring the substrate S into press contact with roof portions of the support plates 14, 14 and releases the substrate S from the fixed state by lowering the support pins 17.

The head 18 has the nozzle 28 on its lower surface. The head 18 is detachably attached to a front surface of an X-axis slider 20. The X-axis slider 20 is slidably attached to a pair of upper and lower guide rails 22, 22 that are provided on a front surface at a Y-axis slider 24 so as to extend in the left and right direction. The Y-axis slider 24 is integrated with a nut 23 screwed to a Y-axis ball screw 25 and is slidably attached to a pair of left and right guide rails 26, 26 that extend in the front and rear direction. One end of the Y-axis ball screw 25 is attached to a Y-axis motor 24a and the other end is left free to constitute a free end. A ball screw mechanism configured in the way described above causes the Y-axis slider 24 to slide along the guide rails 26, 26. Namely, rotating the Y-axis motor 24a rotates the Y-axis ball screw 25, and as the Y-axis ball screw 25 rotates, the nut 23 slides along the guide rails 26, 26 together with the Y-axis slider 24. Although not shown, a ball screw mechanism including an X-axis motor 20a (refer to FIG. 2) causes the X-axis slider 20 to slide along the guide rails 22, 22 in the same manner as the Y-axis slider 24 slides. The head 18 moves in the left and right direction as the X-axis slider 20 moves in the left and right direction and moves in the front and rear direction as the Y-axis slider 24 moves in the front and rear direction.

The nozzle 28 sucks a component to a nozzle tip or releases the component sucked to the nozzle tip by making use of pressure. A pressure at the nozzle 28 is controlled by a pressure controller 28a (refer to FIG. 2). A height of the nozzle 28 is controlled by a Z-axis motor 30 and a ball screw 32 extending along a Z axis both of which are incorporated in the head 18.

The mark camera 34 is installed on a lower surface of the head 18 so that an image capturing direction faces the substrate S and can move in X and Y directions together with the head 18. The mark camera 34 captures an image of a substrate positioning substrata mark, not shown, that is provided on the substrate S and captures a fiducial mark 40 that is disposed in a predetermined position (here, a position lying adjacent to the component camera 36) of the component mounting apparatus 10. The fiducial mark 40 is provided at a predetermined coordinate in an XY-coordinate system of the component mounting apparatus 10 and is set in height substantially as high as the substrate S. The fiducial mark 40 is provided in a position where even though the X-axis slider 20 or the Y-axis slider 24 generates heat, the fiducial mark 40 is not affected or hardly affected by the heat generated.

The component camera 36 is installed between the reel unit 50 and the substrate conveyor unit 12 and substantially at a center of a length in the left and right direction with its image capturing orientation laid upwards. This component camera 36 captures an image of a component sucked to the nozzle 28 that passes thereover.

As shown in FIG. 2, the mounting controller 38 is configured as a microprocessor made up mainly of a CPU38a and additionally includes a ROM 38b that stores processing programs, an HDD 38c that stores various types of data, a RAM 38d that is used as a working area and the like. An input device 38e such as a mouse or a keyboard and a display unit 38f such as a liquid crystal display are connected to the mounting controller 38. The mounting controller 38 is connected to feeder controllers 58 incorporated in feeders 56 and a management computer 80 so as to communicate with them in a bidirectional fashion. The mounting controller 38 is connected to the substrate conveyor unit 12, the X-axis motor 20a, the Y-axis motor 24a, the Z-axis motor 30, the pressure controller 28a of the nozzle 28, the mark camera 34 and the component camera 36 so as to output a control signal thereto. The mounting controller 38 is connected to the mark camera 34 and the component camera 36 so as to receive an image therefrom. For example, the mounting controller 38 recognizes a position of the substrate S by processing an image of the substrate S captured by the mark camera 34 to recognize a position of the substrate mark, not shown, or calculates a deviation of position coordinates by processing an image of the fiducial mark 40 captured by the mark camera 34 to recognize a position of the fiducial mark 40. Additionally, the mounting controller 38 determines whether or not a component is held sucked to the nozzle 28 or determines the shape, size, sucked position and the like of a component held sucked to the nozzle 28 based on an image captured by the component camera 36.

As shown in FIG. 1, the reel unit 50 includes a device pallet 52 and feeders 56. The device pallet 52 has a number of slots 54 on an upper surface thereof. The slots 54 are grooves into which the feeders 56 can be inserted individually. The feeders 56 each hold rotatably a reel 60 around which a tape is wound. A plurality of recess portions, not shown, are formed on the tape so as to be aligned along a longitudinal direction of the tape. Components are individually accommodated in the recess portions. These components are protected by a film, not shown, that covers a surface of the tape. A component suction position is defined on the feeder 56. The component suction position is a position determined by design where the nozzle 28 sucks a component on the tape. Every time the tape is fed backward by a predetermined amount by the feeder 56, components accommodated in the recess portions on the tape are sequentially fed to be disposed in the suction position one by one. The component arriving at the component suction position is exposed with the film protecting the component peeled off and is now ready to be sucked by the nozzle 28.

As shown in FIG. 2, the management computer 80 includes a personal computer main body 82, an input device 84, and a display 86, and input signals from the input device 84 that is operated by an operator can be inputted into the management computer 80. Then, various images can be outputted on to the display 86. Production job data is stored in a memory of the personal computer main body 82. The production job data includes information determining on types of components to be mounted on a substrate S and orders of mounting the components on the substrate S, as well as information determining on the number of substrates S to be fabricated on which the components are so mounted in the component mounting apparatus 10.

Next, an operation will be described below which is to be carried out by the mounting controller 38 of the component mounting apparatus 10 in mounting components on a substrate S based on the production job data (a component mounting operation). Firstly, the mounting controller 38 causes the nozzle 28 of the head 18 to suck a component supplied from one of the feeders 56 of the reel unit 50. Specifically, the mounting controller 38 controls the X-axis motor 20a of the X-axis slider 20 and the Y-axis motor 24a of the Y-axis slider 24 to move the nozzle 28 of the head 18 to a position situated directly above a component suction position of a desired component. Next, the mounting controller 38 controls the Z-axis motor 30 and the pressure controller 28a of the nozzle 28 to lower the nozzle 28 and arrange for a negative pressure to be supplied to the nozzle 28, respectively. This enables a desired component to be sucked to a tip portion of the nozzle 28. Thereafter, the mounting controller 38 raises the nozzle 28, controls the X-axis slider 20 and the Y-axis slider 24, and moves the nozzle 28 having the desired component sucked to a tip thereof to a position situated above a predetermined position on the substrate S. Then, the mounting controller 38 lowers the nozzle 28 down to the predetermined position and controls the pressure controller 28a to supply the atmospheric pressure to the nozzle 28. This separates the component sucked to the nozzle 28 therefrom to mount it in the predetermined position on the substrate S. Similarly, the mounting controller 38 mounts other components to be mounted on the substrate S sequentially on the substrate S in the same manner and feeds the substrate S to a downstream side when having mounted all the necessary components on the substrate S.

Figure 3:
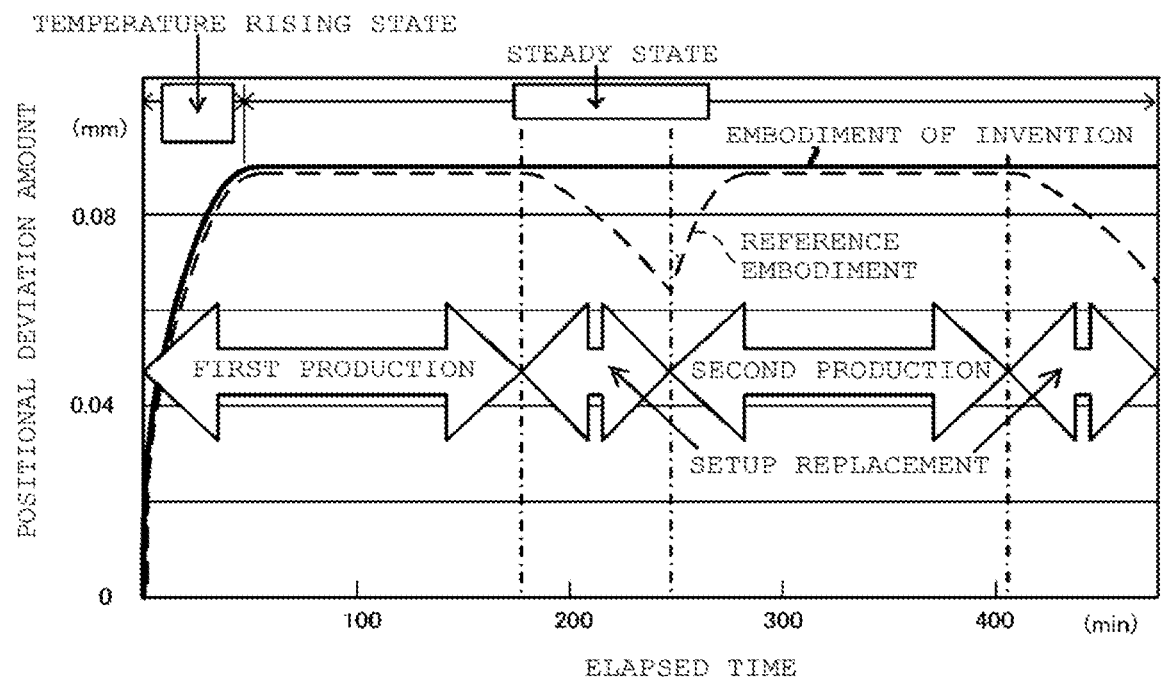
FIG. 3 is a graph representing a relationship between time and positional deviation amount.

When the power supply of the component mounting apparatus 10 is turned on from a state where the power supply is turned off (with the temperature of the apparatus completely lowered) to start a component mounting operation for a first projection job, the component mounting apparatus 10 generates heat as the X-axis slider 20 and the Y-axis slider 24 repeatedly move in the X and Y directions, respectively. Since the Y-axis ball screw 25 is attached to the Y-axis motor 24a at the one end and is made free at the other end thereof, the Y-axis ball screw 25 extends in the Y-axis direction when it is heated to a high temperature by the heat generated in the component mounting apparatus 10. This also applies similarly to an X-axis ball screw, not shown. Then, the ball screws extend long gradually, because the temperature gradually rises for a while (for example, 40 minutes or 50 minutes) after the component mounting operation is started. This state will be referred to as a temperature rising state. In the temperature rising state, the component mounting operation is performed while performing a thermal correction. In the thermal correction, the mark camera 34 captures the fiducial mark 40 in the middle of the component mounting operation. Then, positional deviation amounts in the X and Y directions are calculated based on a coordinate position of the fiducial mark 40 that is obtained from a captured image thereof to obtain correction amounts based on the positional deviation amounts so calculated. Then, positioning coordinates are corrected based on the correction amounts obtained. This thermal correction takes several tens of seconds. When the temperature rising state ends, the temperature becomes substantially constant, and therefore, the respective lengths of the ball screws also become substantially constant. This state will be referred to as a steady state. In the steady state, the positional deviation amount becomes substantially constant. Therefore, the positioning coordinates should be corrected based on correction amounts resulting immediately after the steady state is achieved without performing any thermal correction (steady state correction amounts). When the first production job is finished, the operator makes a necessary preparation or setup replacement for a second production job. The setup replacement refers to an operation of mounting feeders 56 for use in another production job on the component mounting apparatus 10 or changing automatically a conveying width of the substrate conveyor unit 12 before the production job is started. In the case where the X-axis slider 20 and the Y-axis slider 24 are left stopped during the setup replacement, these temperatures of these sliders gradually decrease. To deal with this problem, in this embodiment, a dummy operation is performed to maintain the steady state even during the setup replacement. Namely, although no component is mounted, the steady state is maintained by moving repeatedly the X-axis slider 20 and the Y-axis slider 24 in the X and Y directions, respectively. Since this enables the steady state to be available from a second projection job onward immediately after it is started, it is possible to perform the component mounting operation by correcting the positioning coordinates based on the steady state correction amounts without performing any thermal correction. In FIG. 3, a thick line indicates a relationship between time and positional deviation amount in this embodiment, and a broken line indicates a relationship between time and positional deviation amount with no dummy operation performed (a reference embodiment). In the reference embodiment, since another temperature rising state also exists in a second production job, the component mounting operation needs to be performed while performing the thermal correction.

Figure 4:
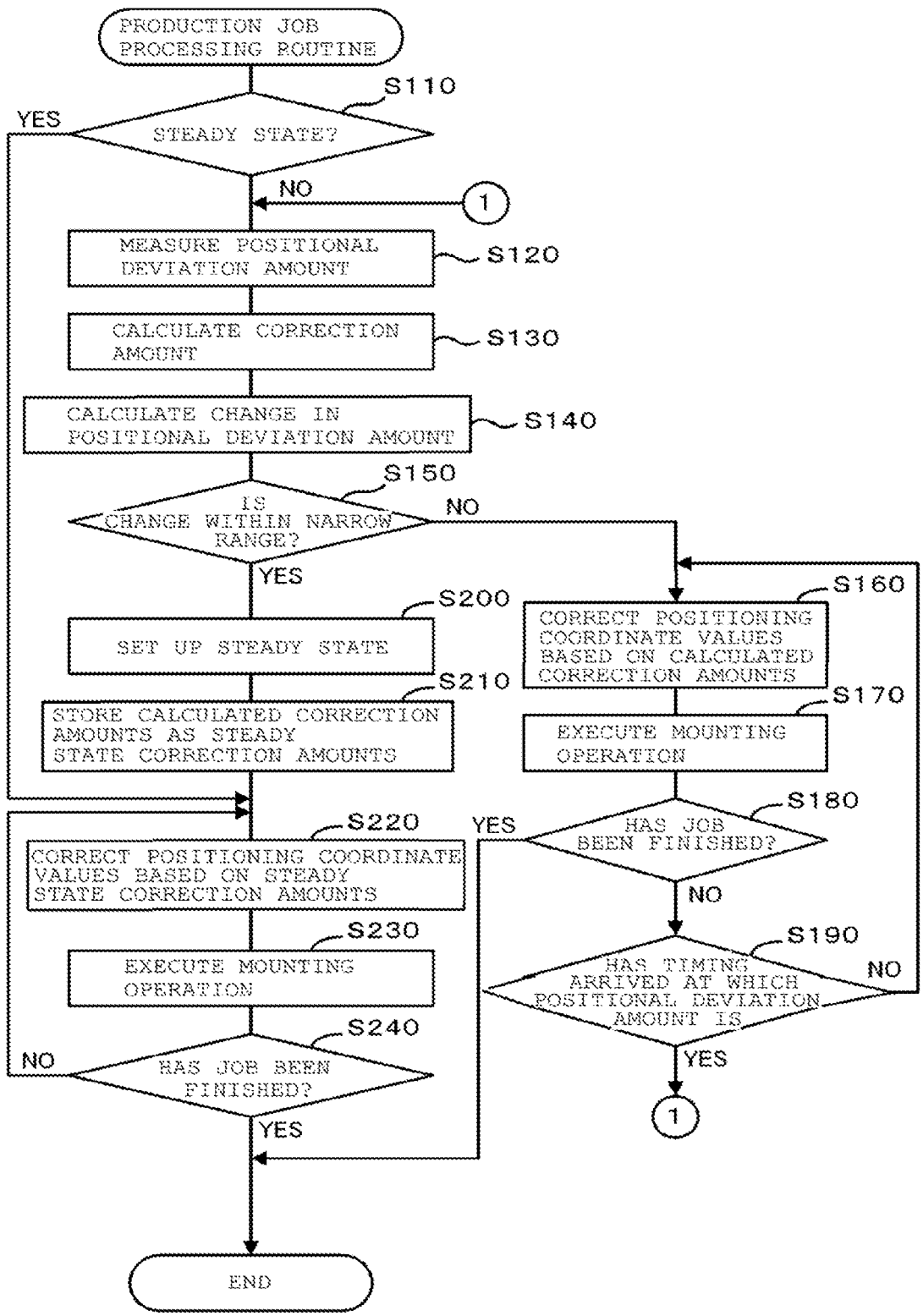
FIG. 4 is a flowchart of a production job processing routine.
Figure 5:
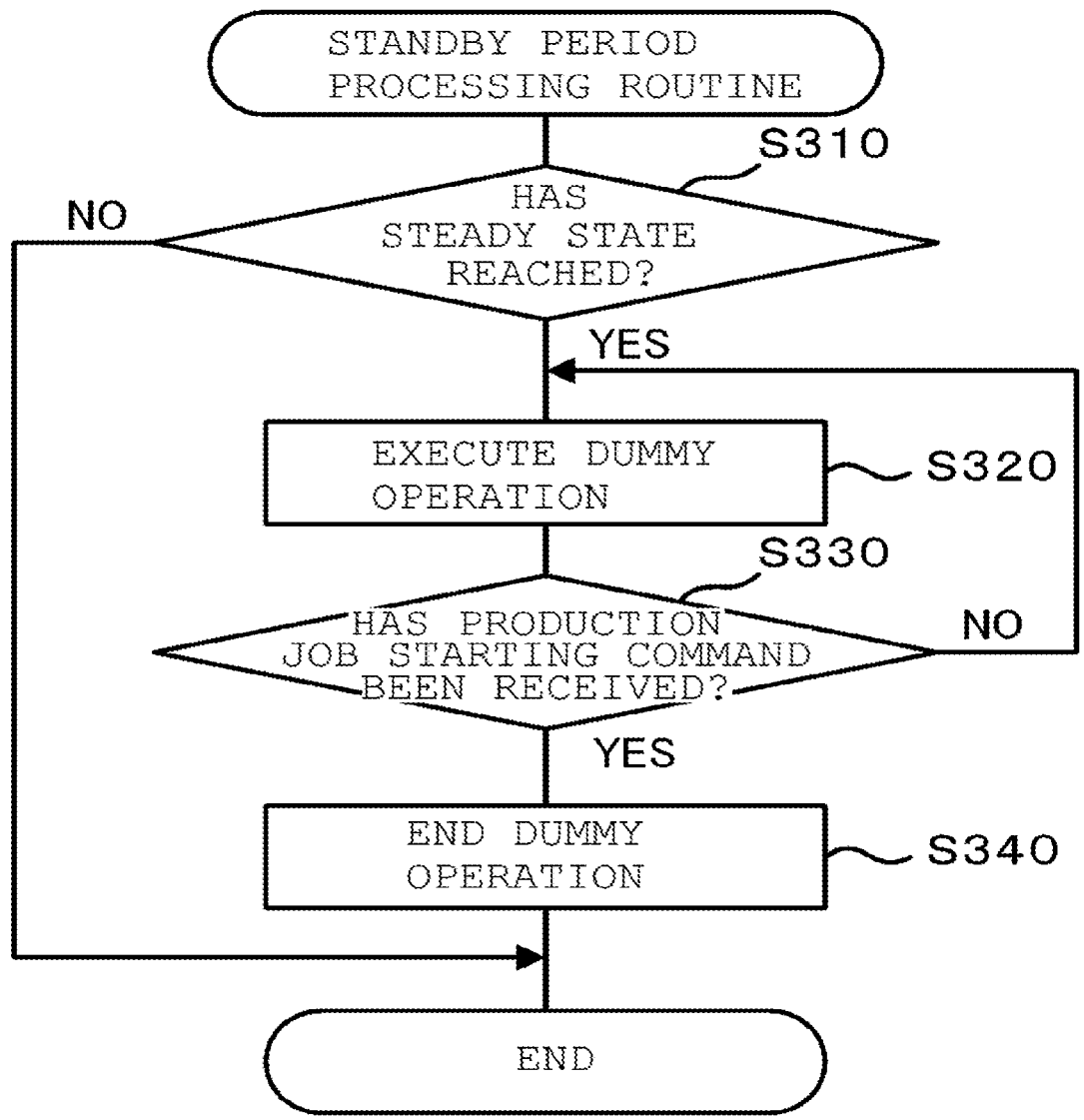
FIG. 5 is a flowchart of a processing routine during a standby period.

Next, referring to flowcharts in FIGS. 4 and 5, a production job processing routine and a processing routine during a standby period of the component mounting apparatus 10 will be described below. Programs for these routines are stored in the ROM38b of the mounting controller 38.

When a command of starting a new production job is inputted thereinto, the CPU38a of the mounting controller 38 starts a production job processing routine for the new production job. Firstly, the CPU38a determines whether or not the component mounting apparatus 10 is now in the steady state (Step S110). Whether or not the component mounting apparatus 10 is in the steady state is determined based on whether a steady state flag is on or off. Although the steady state flag is set on in Step S200, which will be described later, the steady state flag is automatically set off when the power supply of the component mounting apparatus 10 is turned off. Since the steady state has not yet been achieved in an initial stage of the first projection job, a negative determination is made in Step S110.

Next, the CPU38a measures a positional deviation amount (Step S120). For example, the CPU38a rotates the X-axis motor 20a and the Y-axis motor 24a by a predetermined reference rotational amount. The reference rotation amount is set so that a center of the mark camera 34 is positional directly above the fiducial mark 40 when, for example, the X-axis and Y-axis ball screw mechanisms are at a predetermined temperature (for example, 20° C.). When the temperatures of the X-axis and Y-axis ball screw mechanisms are increased to be higher than the predetermined temperature, since the ball screws extend, the center of the mark camera 34 deviates from the position situated directly above the fiducial mark 40 when the X-axis and Y-axis motors are rotated by the reference rotational amount. Positional deviation amounts in the X direction and the Y direction then are calculated from an image captured by the mark camera 34.

Next, the CPU38a calculates correction amounts (Step S130). Here, the CPU38a calculates correction amounts so that the positional deviation amounts measured this time are cancelled.

Next, the CPU38a calculates changes in the positional deviation amounts measured this time (Step S140). Here, the CPU38a calculates differences between the current positional deviation amounts and the previous positional deviation amounts as changes in the positional deviation amounts. The previous positional deviation amounts do not exist immediately after the routine is started, and therefore, the previous positional deviation amounts are regarded as zero. In this embodiment a timing at which positional deviation amounts are measured occurs every predetermined period as will be described later. Due to this, a change in positional deviation amount can be regarded as a ratio of change in positional deviation amount to time.

Next, the CPU38a determines whether or not a calculated change of the positional deviation amount stays within a predetermined narrow range (Step S150). The predetermined narrow range is a range in which the lengths of the X-axis and Y-axis ball screws can be regarded as being substantially constant and is determined in advance empirically. For example, the predetermined narrow range is set at a range of ±several μm.

A negative determination is made in Step S150 in the initial stage of the first production job after the start thereof. If a negative determination is made in Step S150, the CPU38a corrects the positioning coordinate values of the component suction position and the component mounting position on the substrate S based on the correction amounts calculated in Step S140 (Step S160). Following this, the CPU38a controls the motors 20a, 24a, 30 of the component mounting device 10 so that a component mounting operation is performed based on the corrected positioning coordinate values and communicates with the feeder controller 58 (Step S170). Thereafter, when the nozzle 28 sucks a component from the feeder 56 and mounts the component on the substrate S completely, the CPU38a determines whether or not the current production job has been finished (Step S180). If the CPU 38a determines that the current projection job has not yet been finished, the CPU 38a determines whether or not the timing at which positional deviation amounts are measured has arrived (Step S190). The positional deviation amount measuring timing comes every predetermined period (for example, several minutes). If the CPU 38a determines in Step S190 that the positional deviation amount measuring timing has not yet arrived, the CPU38a performs the steps from Step S160 onwards.

On the other hand, if the CPU 38a determines in Step S190 that the timing at which positional deviation amounts are measured has arrived, the CPU 38a performs the steps from Step S120 onwards. Since the temperatures of the respective portions of the component mounting device 10 gradually increase until a certain period of time (for example, several tens of minutes) elapses after the start of the first production job, changes in positional deviation amounts exceed the narrow range, and a negative determination is made in Step S150, and the CPU 38a performs the steps of S160 to S190.

However, when the certain period of time has elapsed since the start of the first production job, the temperatures of the portions of the component mounting device 10 increase completely to be substantially constant, whereby the changes in positional deviation amounts come to concentrate within the narrow range, and an affirmative determination is made in Step S150. If an affirmative determination is made in Step S150, the CPU38a sets on a steady state flag (Step S200) and stores the correction amounts calculated immediately before then as steady state correction amounts in the RAM 38d (Step S210). Following this, the CPU38a corrects the positioning coordinate values of the component suction position and the component mounting position on the substrate S based on these steady state corrections (Step S220). Then, the CPU38a controls the motors 20a, 24a, 30 of the component mounting device 10 so that the component mounting operation is performed based on the corrected positioning coordinate values and communicates with the feeder controller 58 (Step S230). Thereafter, when the nozzle 28 sucks a component from the feeder 56 and mounts the component on the substrate S completely, the CPU38*a* determines whether or not the current production job has been completed (Step S240). If the CPU 38*a* determines that the current production job has not yet been completed, the CPU38*a* returns to Step S220. Namely, after the steady state is realized, no thermal correction (Steps S120, 130) is performed. Then, if the current production job is finished in Step S240 or Step S180, the CPU38*a* ends the production job processing routine.

When one production job is finished, the CPU38*a* determines that the component mounting apparatus 10 has entered a standby period and reads out a standby period processing routine from the ROM 38*b* to execute the routine. It should be noted that the operator performs a setup replacement for the next operation job during the standby period. When the CPU38*a* starts the standby period processing routine, firstly, the CPU 38*a* determines whether or not the component mounting apparatus 10 is in the steady state (Step S310). If the CPU 38*a* determines that the component mounting apparatus 10 is not in the steady state, the CPU 38*a* ends this routine then. On the other hand, if the CPU 38*a* determines in Step S310 that the component mounting apparatus 10 is in the steady state, the CPU 38*a* executes a dummy operation (Step S320). Namely, although no component is mounted, the steady state is maintained by moving repeatedly the X-axis slider 20 and the Y-axis slider 24 in the X and Y directions, respectively. This dummy operation is performed in an area where the operator does not insert his or her hand when the operator detaches and attaches the feeder 56 again, that is, in an area situated further inwards than a front surface 57*a* of the cover 57. Following this, the CPU38*a* determines whether or not a new production job starting command has been input (Step S330). If the CPU 38*a* determines that no new production starting command has not yet been inputted, the CPU 38*a* returns to Step S320 to continue the dummy operation. On the other hand, if the CPU 38*a* determines in Step S330 that the new production job starting command has been inputted, the CPU38*a* ends the dummy operation (Step S340), ending the standby period processing routine. At the same time, the CPU38*a* resumes the production job processing routine.

When the CPU38*a* resumes the production job process routine, firstly, the CPU 38 determines whether or not the component mounting apparatus 10 is in the steady state (Step S110). When a second production job is started, since the dummy operation was executed during the standby period immediately before the start of the second job routine, the steady state is maintained. Due to this, the CPU38*a* makes an affirmative determination in Step S110 and skips the steps to Step S220. Then, the CPU38*a* corrects the positioning coordinate values based on the steady state correction amounts without performing any thermal correction (Step S220) and executes the component mounting operation (Step S230) until the CPU 38*a* determines in Step S240 that the second production job has been completed.

Here, a corresponding relationship between the constituent elements of this embodiment and constituent elements of the disclosure will be clarified. The X-axis slider 20 and the Y-axis slider 24 of the embodiment correspond to an XY-robot, the feeder 56 of the reel unit 50 corresponds to a component supply device, and the mounting controller 38 corresponds to a control unit of the disclosure. The front surface 57*a* of the cover 57 corresponds to a partition.

According to the component mounting apparatus 10 of the embodiment that has been described heretofore, the component mounting operation is repeatedly performed while performing the thermal correction until the amount of positional deviation due to the heat from the X-axis slider 20 and the Y-axis slider 24 reaches the steady state after the start of the component mounting operation as a result of the power supply being turned on. Namely, the component mounting apparatus performs the component mounting operation even during the period when the steady state has not yet been achieved. Additionally, after the steady state is achieved, the component mounting apparatus performs repeatedly the component mounting operation while performing the steady state correction using the correction amount resulting immediately after the steady state is achieved without performing the thermal correction and performs the dummy operation to maintain the steady state during the standby time during which the component mounting operation is not performed. Namely, since the component mounting operation is performed without performing the thermal correction after the steady state is achieved, the frequency at which the thermal correction is performed is reduced. In addition, since the steady state is maintained by performing the dummy operation during the standby period, from example, even though the component mounting apparatus 10 is put in the standby period after one component mounting operation based on one production job is completed, once a component mounting operation based on the next production job is prepared, the component mounting apparatus 10 can start the next production job as soon as possible without performing the thermal correction.

Additionally, since the dummy operation is performed in the area where the operator does not insert his or her hand when the operator detaches and attaches again the feeder 56, that is, the area situated further inwards than the front surface 57*a* of the cover 57 in the embodiment described above, the operator can safely detach and attach again the feeder 56.

Further, since the amounts of positional deviation due to the thermal deformation of the X-axis and Y-axis ball screw mechanisms are measured in performing the thermal correction, the time required for the thermal correction is lengthened, whereby it is highly meaningful in reducing the frequency at which the thermal correction is performed.

Furthermore, since whether or not the positional deviation amount has reached the steady state is determined based on the change in positional deviation amount, whether or not the positional deviation amount has reached the steady state can be determined with good accuracy.

It should be noted that the disclosure is not limited to the embodiment that has been described heretofore, and hence, needless to say, the disclosure can be carried out in various forms without departing from the spirit and scope of the disclosure.

For example, in the embodiment described above, the thermal correction is described as being performed in consideration that the X-axis and Y-axis ball screws extend or contract due to heat. However, the thermal correction may be performed in consideration that the distance between the nozzle 28 and the mark camera 34 that are provided on the lower surface of the head 18 is made longer or shorter by heat. The distance between the nozzle 28 and the mark camera 34 can be measured by making use of an image thereof captured by the component camera 36. In addition, the thermal correction may be performed in consideration that the Z-axis ball screw 32 extends or contracts due to head. As this occurs, for example, a camera capable of capturing an image of the nozzle 28 from the side thereof may be attached to the head 18, whereby an image of the nozzle 28 captured by the camera is made use of to measure an amount of deviation in the Z-axis direction. In any case, after the steady state is realized, the component mounting operation is repeatedly performed while performing the steady state correction using the correction amount resulting immediately after the steady state is realized without performing the thermal correction.

In the embodiment described above, whether or not the steady state is realized based on whether or not the change in positional deviation amount stays within the predetermined narrow range in Step S150. However, the determination method is not limited thereto. For example, whether or not the steady state is realized may be determined based on a transition of the change in positional deviation amount. Specifically, whether or not the steady state is realized may be determined based on whether or not a difference between the previous change in positional deviation amount and the current change in positional deviation amount is equal to or smaller than a predetermined slight difference.

In the embodiment described above, the time during which the setup replacement is performed is exemplified as the standby period. However, the standby period is not limited thereto. For example, there may be a case where during the execution of one production job, some trouble occurs in the component mounting apparatus 10, for example, a replenishment of components has to be waited for due to a component shortage, whereby the component mounting operation is interrupted. Then, a period during which the component mounting operation is interrupted may be used as the standby period. Alternatively, a time for replacing substrates S may be used as the standby period.

In the embodiment described above, the mounting controller 38 may be made not to execute the standby period processing routine when the cover 57 covering the whole of the component mounting apparatus 10 is left open. By adopting this configuration, no dummy operation is performed when the cover 57 is left open.

In the embodiment described above, although the head 18 is described as having one nozzle 28, the disclosure is not particularly limited thereto, and hence, a head having a multiple nozzles (for example, a rotary head having a multiple nozzles aligned along a circumference thereof) may be used.

In the embodiment described above, although the sliders having the ball screw mechanism are described as the X-axis slider 20 and the Y-axis slider 24, the disclosure is not particularly limited thereto, and hence, for example, a slider including a linear motor in place of the ball screw mechanism may be used as the sliders.

In the embodiment described above, although in the thermal correction, the amounts of positional deviation in the X and Y directions are calculated from the image of the fiducial mark 40 captured by the mark camera 34 in the midst of the component mounting operation to obtain the correction amounts based on the amounts of positional deviation so calculated, the disclosure is not particularly limited thereto. For example, a configuration may be adopted in which a fiducial mark is provided in a predetermined position on the lower surface of the head 18, and the fiducial mark is captured by the component camera 36 in the midst of the component mounting operation to obtain amounts of positional deviation in the X and Y directions based on coordinate positions of the fiducial mark that are obtained from the captured image, whereby the positioning coordinates are corrected based on the calculated positional deviation amounts. By adopting this configuration, since the thermal expansion or contraction of the head 18 is taken into consideration, the magnitude of the thermal deformation can be measured more accurately than in the embodiment described above.

In the embodiment described above, although the dummy operation is performed in the steady state, the dummy operation may also be performed even in the temperature rising state. By doing so, it is possible to shift to the steady state more quickly, thereby making it possible to reduce the number of times of performing the thermal correction processing.

INDUSTRIAL APPLICABILITY

The present disclosure can be applied to a component mounting apparatus for mounting, for example, various types of electronic components of different sizes on a substrate.

EXPLANATION OF REFERENCE NUMERALS 10 component mounting apparatus, 12 substrate conveyor units, 14 support plate, 16 conveyor belt, 18 head, 20 X-axis slider, 20a X-axis motor, 22 guide rail, 23 nut, 24 Y-axis slider, 24a Y-axis motor, 25 Y-axis ball screw, 26 guide rail, 28 nozzle, 28a pressure controller, 30 Z-axis motor, 32 ball screw, 34 mark camera, 36 component camera, 38 mounting controller, 38a CPU, 38b ROM, 38c HDD, 38d RAM, 38e input device, 38f display unit, 40 fiducial mark, 50 reel unit, 52 device pallet, 54 slot, 56 feeder, 57 cover, 57a front surface, 58 feeder controller, 60 reel, 62, tape, 80 management computer, 82 personal computer main body, 84 input device, 86 display.

The invention claimed is:

1. A component mounting apparatus having a nozzle attached to a head movable in an XY-plane using an XY-robot and configured to perform a component mounting operation in which the nozzle sucks a component supplied from a component supply device, carries the component to a predetermined position on a substrate and mounts the component in the predetermined position, the component mounting apparatus comprising:
    a control unit configured to
        control the XY-robot to perform repeatedly the component mounting operation while performing a thermal correction during a temperature rising period that begins with a temperature of the component mounting apparatus substantially at ambient temperature and ends when an amount of positional deviation due to heat from the XY-robot reaches a steady state,
        after the positional deviation amount has reached the steady state, control the XY-robot to perform repeatedly the component mounting operation while performing a steady state correction using a correction amount resulting immediately after the positional deviation amount reaches the steady state, and
        control the XY-robot to perform a dummy operation to maintain the steady state during a standby period when the component mounting operation is not performed after the positional deviation amount has reached the steady state.

2. The component mounting apparatus according to claim 1,
    wherein the component supply device is detachably attached to the component mounting apparatus, and wherein the control unit controls the XY-robot to perform the dummy operation in an area where a hand is not inserted when an operator attaches or detaches the component supply device.

3. The component mounting apparatus according to claim 1,
wherein a partition is provided between the component supply device and an area of the component mounting apparatus where the head moves, and
wherein the control unit controls the XY-robot to perform the dummy operation further inwards of the component mounting apparatus than the partition.

4. The component mounting apparatus according to claim 1,
wherein in performing the thermal correction, the control unit measures the positional deviation amount, calculates a position correcting amount of the XY-robot according to a magnitude of the positional deviation amount and corrects a position of the XY-robot using the position correcting amount.

5. The component mounting apparatus according to claim 1,
wherein the control unit determines whether or not the positional deviation amount reaches the steady state based on a change with time of the positional deviation amount or a transition in the change.

6. The component mounting apparatus according to claim 1, further comprising:
a mark camera configured to image a fiducial mark of the substrate,
wherein the control unit measures the positional deviation amount based on the image, calculates a position correcting amount of the XY-robot according to a magnitude of the positional deviation amount, and corrects a position of the XY-robot using the position correcting amount during the temperature rising period.

* * * * *